(12) United States Patent
Jin

(10) Patent No.: US 10,090,170 B2
(45) Date of Patent: Oct. 2, 2018

(54) SEMICONDUCTOR FABRICATION METHOD INCLUDING NON-UNIFORM COVER LAYER

(71) Applicants: Semiconductor Manufacturing International (Shanghai) Corporation, Shanghai (CN); Semiconductor Manufacturing International (Beijing) Corporation, Beijing (CN)

(72) Inventor: Lan Jin, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/477,153

(22) Filed: Apr. 3, 2017

(65) Prior Publication Data
US 2017/0330765 A1    Nov. 16, 2017

(30) Foreign Application Priority Data
May 12, 2016  (CN) .......................... 2016 1 0315813

(51) Int. Cl.
*H01L 21/20*    (2006.01)
*H01L 21/461*   (2006.01)
(Continued)

(52) U.S. Cl.
CPC ...... *H01L 21/461* (2013.01); *H01L 21/02002* (2013.01); *H01L 21/02008* (2013.01);
(Continued)

(58) Field of Classification Search
None
See application file for complete search history.

(56) References Cited

U.S. PATENT DOCUMENTS

2008/0286957 A1    11/2008  Lee et al.
2012/0056245 A1    3/2012   Kang et al.
(Continued)

OTHER PUBLICATIONS

The European Patent Office (EPO) The Extended European Search Report for 17169769.1 dated Sep. 11, 2017 9 Pages.

*Primary Examiner* — Cory Eskridge
(74) *Attorney, Agent, or Firm* — Anova Law Group, PLLC

(57) ABSTRACT

A method is provided for fabricating a semiconductor structure. The method includes forming a base substrate including a substrate and a stress layer formed in the substrate, where a top surface of the stress layer is higher than a surface of the substrate. The method also includes forming a first cover layer, where a first growth rate difference exists between growth rates of the first cover layer on the top surface of the stress layer and the first cover layer on a side surface of the stress layer. Further, the method includes forming a second cover layer, where a second growth rate difference exists between growth rates of the second cover layer on the top surface of the stress layer and the second cover layer on the side surface of the stress layer, and the second growth rate difference is larger than the first growth rate difference.

19 Claims, 4 Drawing Sheets

(51) Int. Cl.
*H01L 21/02* (2006.01)
*H01L 21/302* (2006.01)
*H01L 29/66* (2006.01)
*H01L 29/78* (2006.01)
*H01L 29/165* (2006.01)

(52) U.S. Cl.
CPC .... *H01L 21/0262* (2013.01); *H01L 21/02532* (2013.01); *H01L 21/02636* (2013.01); *H01L 21/302* (2013.01); *H01L 29/665* (2013.01); *H01L 29/66636* (2013.01); *H01L 29/7848* (2013.01); *H01L 29/165* (2013.01)

(56) References Cited

U.S. PATENT DOCUMENTS

| | | |
|---|---|---|
| 2013/0149830 A1 | 6/2013 | Rhee et al. |
| 2014/0084350 A1* | 3/2014 | Kim ................. H01L 29/78 257/255 |
| 2014/0264348 A1* | 9/2014 | Tsai ................. C30B 25/165 257/57 |
| 2016/0020301 A1 | 1/2016 | Park et al. |

* cited by examiner

SEMICONDUCTOR FABRICATION METHOD INCLUDING NON-UNIFORM COVER LAYER

CROSS-REFERENCES TO RELATED APPLICATIONS

This application claims the priority of Chinese patent application No. 201610315813.9, filed on May 12, 2016, the entirety of which is incorporated herein by reference.

FIELD OF THE INVENTION

The present invention generally relates to the field of semiconductor manufacturing and, more particularly, relates to a semiconductor structure and fabrication techniques thereof.

BACKGROUND

With the continuous development of semiconductor technology, dimensions of semiconductor devices continue to decrease. With the reduction of the dimensions of the semiconductor devices, the impact of contact resistance of Metal-Oxide-Semiconductor (MOS) transistors on the performance of the MOS transistors and the performance of the entire semiconductor chip is gradually increasing. To improve the performance of the semiconductor chip, the contact resistance of the MOS transistors needs to be reduced. With the reduction of the dimensions of the semiconductor devices, the areas of the source region and the drain region become smaller and smaller. Therefore, the contact resistance between the source region, the drain region and the metal plug increases with the decreasing of the dimension of the semiconductor device. The large contact resistance between the source region, the drain region and the metal plug affects the performance of the MOS transistor and limits the operation speed of the semiconductor device.

Self-aligned silicide (Salicide) formed on the source region and the drain region can effectively reduce the contact resistance between the source region, the drain region and the metal plug. Currently, the process for forming the self-aligned silicide often includes: forming a metal layer on the silicon layer by an evaporation process or a sputtering process; performing an annealing process, such that the metal and silicon can react to form metal silicide; and removing the metal layer not reacted with the silicon.

In addition, to improve the operation speed of the chip and to improve the performance of the MOS transistor, the mobility of carriers in the channel is improved by introducing a stress layer in the source region and the drain region of the MOS transistor. The source region and the drain region of the MOS transistor made of germanium silicon material or carbon silicon material can introduce compressive stress or tensile stress in the channel region of the MOS transistor, thus improving the performance of the MOS transistor.

However, with the reduction of the dimensions of the semiconductor devices, the dimensions of the MOS transistors also decrease accordingly, it is more difficult to form the self-aligned silicide, resulting in the decreasing of the performance of the MOS transistors. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes forming a base substrate including a substrate and a stress layer formed in the substrate, wherein a top surface of the stress layer is higher than a surface of the substrate. The method also includes forming a first cover layer on the stress layer, wherein a first growth rate difference exists between a growth rate of the first cover layer on the top surface of the stress layer and a growth rate of the first cover layer on a side surface of the stress layer. Further, the method includes forming a second cover layer on the first cover layer, wherein a second growth rate difference exists between a growth rate of the second cover layer on the top surface of the stress layer and a growth rate of the second cover layer on the side surface of the stress layer, and the second growth rate difference is larger than the first growth rate difference.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or the alike parts.

Figure 1:
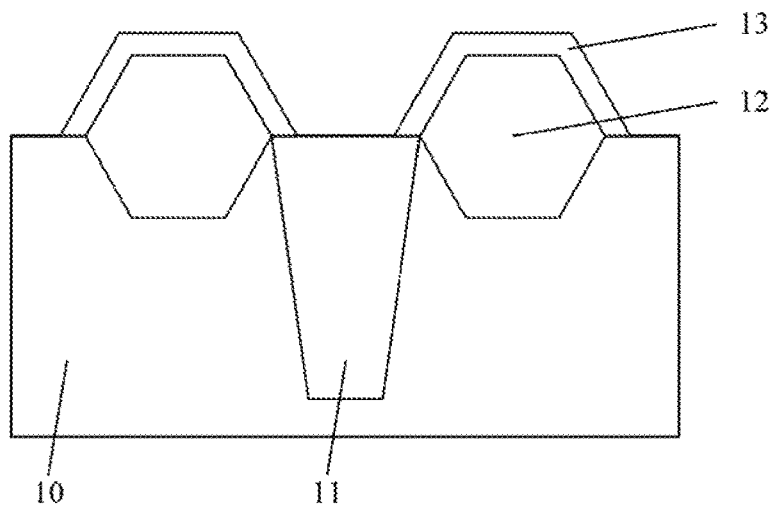
FIG. 1 illustrates an existing semiconductor structure.

FIG. 1 illustrates an existing semiconductor structure according to an existing fabrication process to form the self-aligned silicide on the stress layer, and the semiconductor structure can be configured to form a PMOS device.

As shown in FIG. 1, the semiconductor structure includes a substrate 10 and an isolation structure 11 formed in the substrate 10. The semiconductor structure also includes a stress layer 12 formed in the substrate 10 at both sides of the isolation structure 11. The top surface of the stress layer 12 is higher than the top surfaces of the substrate 10 and the isolation structure 11.

The stress layer 12 is configured as a source region and/or a drain region of a transistor. To reduce the contact resistance between the source region and/or the drain region of the transistor and the metal plug, low resistance metal silicide is formed on the stress layer 12 by a self-aligned silicide process. Specifically, forming the metal silicide includes sequentially forming a silicon layer 13 and a metal layer on the stress layer 12; and performing an annealing process, such that the metal and silicon layer 13 can react to form metal silicide.

During forming the stress layer 12, stress materials can be overfilled to introduce sufficient stress, such that top surface of the stress layer 12 is higher than the top surfaces of the substrate 10 and the isolation structure 11. Therefore, the surface of the stress layer 12 includes the top surface and side surface.

Because the semiconductor structure is configured to form a PMOS device, the stress layer 12 is made of "Σ" shaped silicon germanium material. The top surface of the stress layer 12 is a (100) crystal plane, and the side surface of the stress layer 12 is a (111) crystal plane.

Because the growth rates of the silicon layer 13 on different crystal planes are different, during the self-aligned silicide process, the thickness of the silicon layer 13 on the side surface of the stress layer 12 is different from the thickness of the silicon layer 13 on the top surface of the stress layer 12.

If the thickness of the silicon layer 13 on the side surface of the stress layer 12 is too small, the metal layer formed on the pretreated silicon layer can be directly contacted with the stress layer 12. During the annealing process, the metal can react with the stress material in the stress layer 12 to form high resistance silicide, such that the contact resistance of the formed source region and/or drain region of the transistor is increased. If the thickness of the silicon layer 13 on the side surface of the stress layer 12 is too thick, the spacing between the silicon layers 13 formed on the opposite side surfaces of the adjacent stress layers can be decreased, or the silicon layers 13 can even be connected. Such that the silicide formed by forming the metal layer and performing the annealing process may be connected. Therefore, a short-circuit issue occurs between the source regions and/or the drain regions of different transistors.

Different silicon sources used in the process of forming the silicon layer 13 can cause the difference between the thickness of the silicon layer 13 formed on the side surface of the stress layer 12 and the thickness of the silicon layer 13 formed on the top surface of the stress layer 12. At the same time, it is difficult to accurately control the thicknesses of the silicon layers 13 formed on the top surface and the side surface of the stress layer by using the same silicon source to form the silicon layer 13 at one time. Therefore, the performance of the formed MOS transistor is poor.

Figure 5:
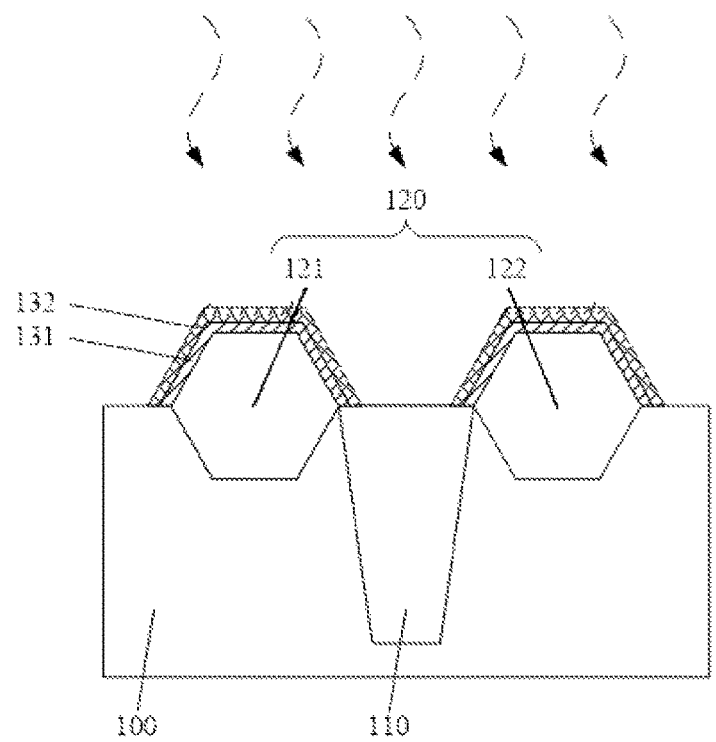
Figure 6:
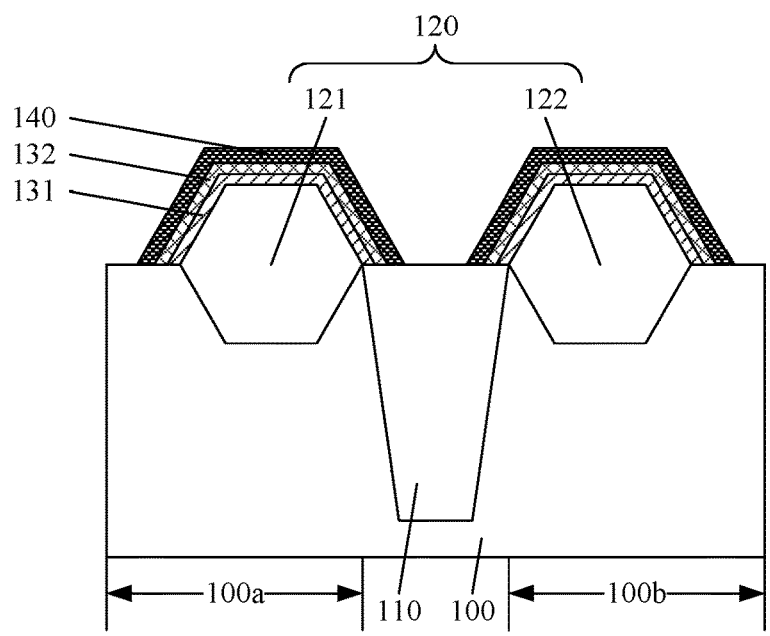
Figure 7:
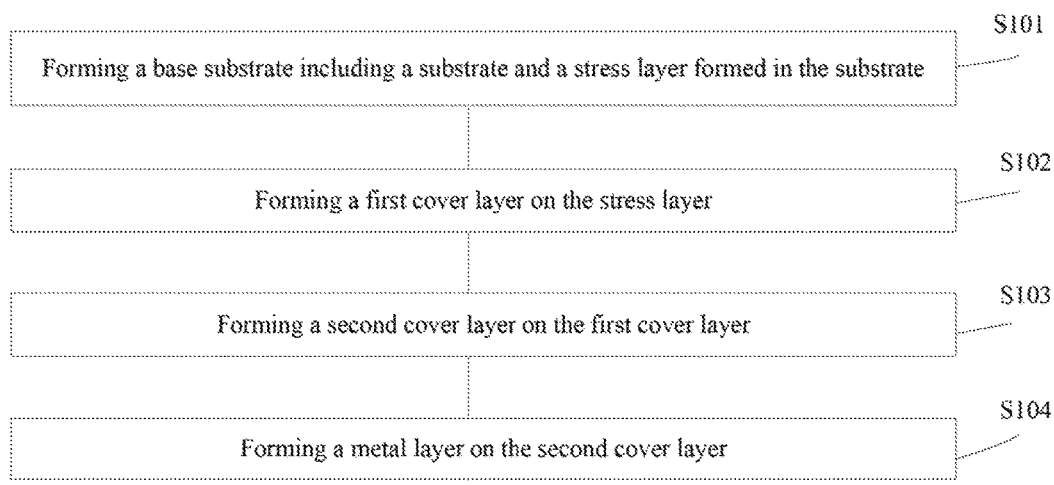
FIG. 7 illustrates an exemplary fabrication process to form a semiconductor structure consistent with the disclosed embodiments.

The present disclosure provides an improved semiconductor structure and fabrication process. FIG. 7 illustrates an exemplary fabrication process to form a semiconductor structure consistent with the disclosed embodiments; and FIGS. 2-6 illustrate semiconductor structures corresponding certain stages of the exemplary fabrication process.

In one embodiment, a semiconductor structure configured to form a PMOS device is described as an example. However, the semiconductor structure consistent with the disclosed embodiments can also be configured to form an NMOS device or other type of semiconductor devices.

Figure 2:
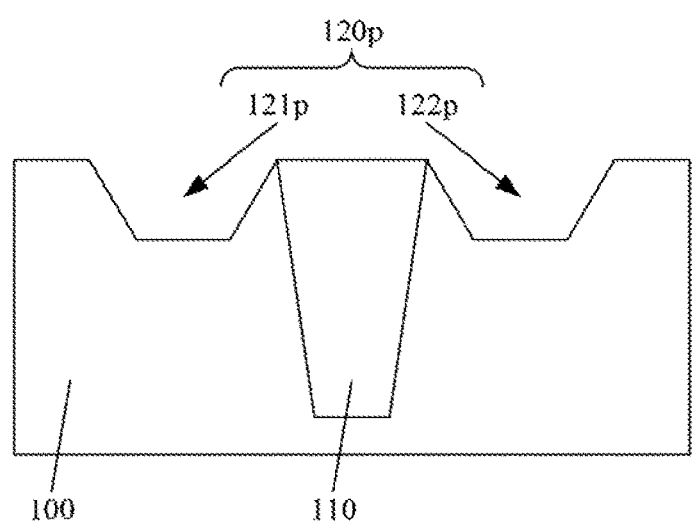
FIGS. 2-6 illustrate semiconductor structures corresponding to certain stages of a fabrication process of a semiconductor structure consistent with the disclosed embodiments.
Figure 3:
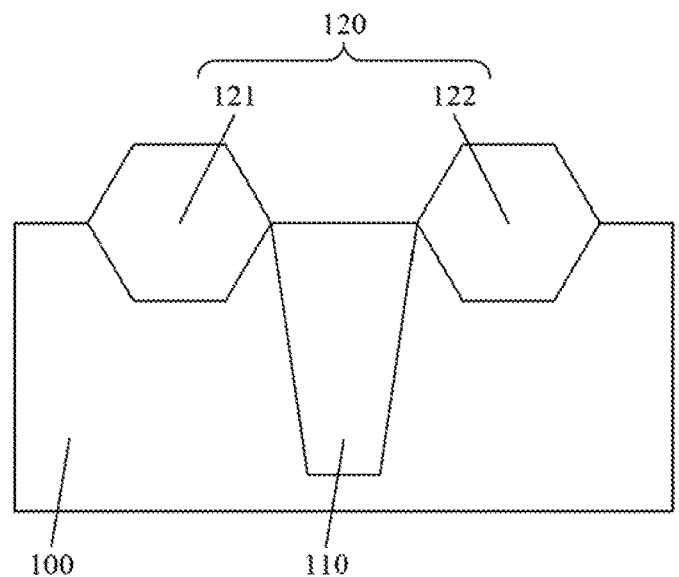

As shown in FIG. 7, at the beginning of the fabrication process, a base substrate with certain structures may be formed (S101). FIGS. 2-3 illustrate corresponding semiconductor structures.

Referring to FIG. 2 and FIG. 3, a base substrate may be first formed. The base substrate may include a substrate 100 and a stress layer 120 formed in the substrate 100. The top surface of the stress layer 120 may be higher than the surface of the substrate 100.

In one embodiment, the base substrate may include a plurality of the discrete stress layers 120, and all the top surfaces of a plurality of the stress layers 120 may be higher than the surface of the substrate 100. Specifically, the base substrate may include a discrete first stress layer 121 and a discrete second stress layer 122. Both the top surfaces of the first stress layer 121 and the second stress layer 122 may be higher than the surface of the substrate 100.

The base substrate may also include an isolation structure 110. A plurality of the stress layers 120 may be implemented in the discrete settings through the isolation structure 110. Specifically, the first stress layer 121 and the second stress layer 122 may be formed at both sides of the isolation structure 110. The top surface of the isolation structure 110 may be level with the surface of the substrate 100. Therefore, both the top surfaces of the first stress layer 121 and the second stress layer 122 may be higher than the top surface of the isolation structure 110.

Specifically, as shown in FIG. 2, forming the base substrate may include first providing the substrate 100. The substrate 100 may provide a platform for subsequent fabrication processes. The substrate 100 may include monocrystalline silicon, polysilicon, or amorphous silicon. The substrate 100 may also include silicon (Si), germanium (Ge), germanium-silicon alloy (GeSi), silicon carbide (SiC), or gallium arsenide (GaAs) and other III-V compounds thereof.

In addition, the substrate 100 may include any appropriate other semiconductor material. Further, the substrate 100 may include silicon substrate having an epitaxial layer or on an epitaxial layer. In one embodiment, a gate structure to form a planar transistor is included, and the substrate 100 may be a monocrystalline silicon substrate.

Forming the base substrate may also include forming an isolation structure 110 in the substrate 100. The isolation structure 110 may be configured to achieve electrical isolation between different devices. In one embodiment, the isolation structure 110 may divide the substrate 100 into two active areas to form semiconductor devices respectively. The isolation structure may be made of an insulating material. Specifically, in one embodiment, the isolation structure may be made of oxide.

Specifically, forming the isolation structure 110 may include: forming a first patterned layer on the substrate 100, where the first patterned layer may be configured to define the dimensions and position of the isolation structure; using the first patterned layer as a mask to etch the substrate 100 to form a trench in the substrate 100; and filling the trench with the insulating material to form the isolation structure 110.

The patterned layer may be a patterned photoresist layer formed by a coating process and a photolithography process. In addition, to reduce dimensions of a subsequent formed metal gate structure and to reduce dimensions of the semiconductor device, the patterned layer may be formed by a multiple patterned mask process. The multiple patterned mask process may include a self-aligned double patterned process (SaDP), a self-aligned triple patterned process (SaTP), or a self-aligned double double patterned process (SADDP).

In addition, referring to FIG. 2, forming the base substrate may include forming an opening 120p in the substrate 100. Specifically, if the substrate includes a plurality of the discrete stress layers 120, forming the opening 120p may include forming a plurality of the discrete openings in the substrate 100.

In one embodiment, the base substrate may include the discrete first stress layer 121 and the discrete second stress layer 122. The first stress layer 121 and the second stress layer 122 may be formed at both sides of the isolation structure 110 respectively. Therefore, forming the opening 120p may include forming a first opening 121p and a second opening 122p at both sides of the isolation structure 110 respectively. The first opening 121p and the second opening 122p may be configured to be filled with the stress material to form the first stress layer and the second stress layer, respectively.

In one embodiment, the semiconductor structure may be configured to form a PMOS device. In other words, the current in the channel of the MOS transistor in the semiconductor structure can be realized by holes. Therefore, compressive stress may need to be introduced into the channel of the formed MOS transistor. A Sigma ("Σ") shaped stress layer may be needed to introduce larger compressive stress. Therefore, the opening dimensions of the first opening 121p and the second opening 122p may be larger than their bottom dimensions.

Forming the first opening 121p and the second opening 122p may include: forming a second patterned layer on the substrate 100, where the second patterned layer may be configured to define the dimensions and position of the first opening 121p and the second opening 122p; and using the second patterned layer as a mask to etch the substrate 100, to form the first opening 121p and the second opening 122p in the substrate. The patterned layer may be a patterned photoresist layer or a mask layer formed by a multiple patterned mask process.

Further, as shown in FIG. 3, after forming the opening 120p, forming the base substrate may include forming the stress layer 120 by filling the opening 120p with the stress material. Specifically, a plurality of the discrete stress layers 120 may be formed in the substrate 100 by filling a plurality of the openings with the stress material.

Specifically, in one embodiment, forming the stress layer 120 may include filling the first opening 121p and the second opening 122p with the stress material to form the first stress layer 121 and the second stress layer 122 respectively.

In one embodiment, the first stress layer 121 and the second stress layer 122 may be formed simultaneously, it can simplify the fabrication process and improve process efficiency. In certain other embodiments, only one stress layer may be formed in the base substrate, or the first stress layer 121 and the second stress layer 122 may be formed separately.

Specifically, in one embodiment, a chemical vapor deposition process may be performed to fill the opening 120p with the stress material to form the stress layer 120. In certain other embodiments, a reduced pressure chemical vapor deposition process may be performed to fill the opening 120p with the stress material.

Because the semiconductor structure may be configured to form a PMOS device, compressive stress may need to be introduced into the channel. Therefore, the stress material may be germanium-silicon material. In other words, the stress layer 120 may be a germanium-silicon stress layer. Specifically, the first stress layer 121 and the second stress layer 122 may be the germanium-silicon stress layer.

Specifically, when performing the reduced pressure chemical vapor deposition process to fill the opening 120p with the germanium-silicon material, the process temperature may be in a range of approximately 550-750° C., and the pressure of the process gas may be in a range of approximately 0-50 Torr. The process gas may include monosilane, disilane and dichlorosilane as silicon source and germane as germanium source.

In addition, when forming the stress layer 120, a P-type doped stress layer may be formed by in-situ doping P-type ions in the stress layer. In other words, the stress layer 120 may be the P-type doped stress layer. Specifically, the first stress layer 121 and the second stress layer 122 may be the P-type doped stress layer. In one embodiment, the P-type ions may be boron ions. Therefore, when performing the reduced pressure chemical vapor deposition process to fill the opening 120p with the germanium-silicon material, the process gas may also include diborane as boron source.

In one embodiment, the shape of the stress layer 120 may be an "Σ" shape to increase the compressive stress in the channel region. Specifically, the first stress layer 121 and the second stress layer 122 may be the "Σ" shaped stress layer. The "Σ" shaped stress layer may have a protruding tip pointing towards the channel region. The germanium-silicon material at the protruding tip may be closer to the channel region and can introduce larger compressive stress in the channel region.

Moreover, the opening 120p (shown in FIG. 2) may be overfilled to introduce sufficient stress, such that the top surface of the formed stress layer 120 may be higher than the surface of the substrate 100. Therefore, the surface of the stress layer 12o may include the top surface and the side surface.

Specifically, the first opening 121p and the second opening 122p (shown in FIG. 2) may be overfilled, such that both the top surfaces of the first stress layer 121 and the second stress layer 122 may be higher than the surface of the substrate 100 and the top surface of the isolation structure 110. Therefore, both the surfaces of the first stress layer 121 and the second stress layer 122 may include the top surfaces and the side surfaces.

Because the stress layer 120 may be an "Σ" shaped germanium-silicon stress layer, the top surface of the stress layer 120 may be the (100) crystal plane, and the side surface of the stress layer 120 may be the (111) crystal plane. Specifically, both the top surfaces of the first stress layer 121 and the second stress layer 122 may be the (100) crystal plane, and both the side surfaces of the first stress layer 121 and the second stress layer 122 may be the (111) crystal plane.

Figure 4:
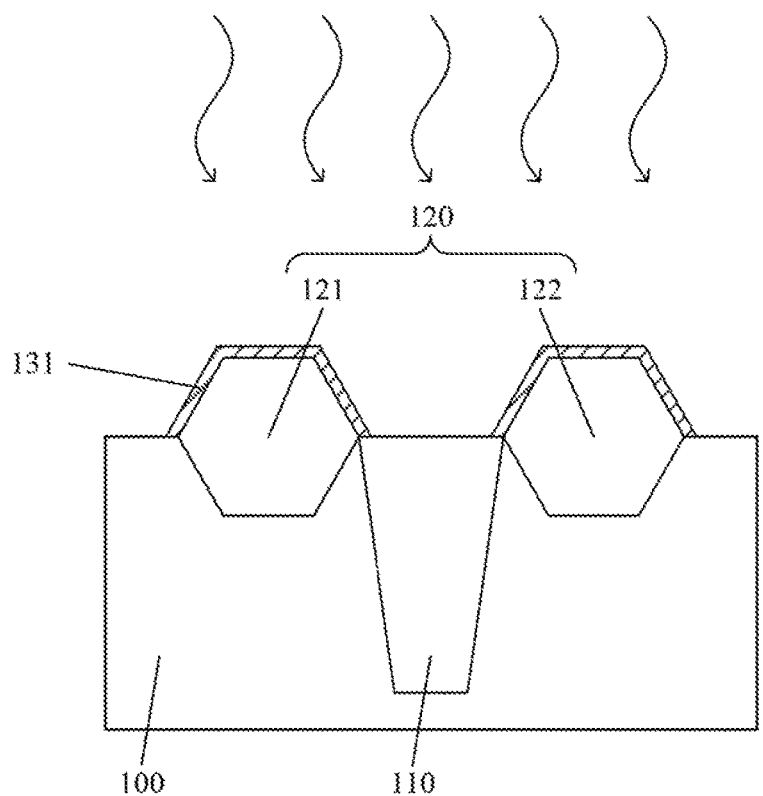

Returning to FIG. 7, after forming the base substrate, a first cover layer may be formed on the stress layer (S102). FIG. 4 illustrates a corresponding semiconductor structure.

As shown in FIG. 4, a first cover layer 131 may be formed on the stress layer 120. The difference in the growth rates of the first cover layer on the top surface and the side surface of the stress layer may be a first growth rate difference.

Specifically, first source gas may be used to form the first cover layer 131 on the stress layer 120. The difference in the deposition rates of the first source gas on the top surface and the side surface of the stress layer 120 may be the first growth rate difference.

The first cover layer 131 may be formed on the stress layer 120 by a chemical vapor deposition process. Specifically, the first cover layer 131 may be formed on the stress layer 120 by a reduced pressure chemical vapor deposition process to improve the forming quality of the first cover layer 131.

Returning to FIG. 7, after forming the first cover layer, a second cover layer may be formed on the first cover layer (S103). FIG. 5 illustrates a corresponding semiconductor structure.

As shown in FIG. 5, a second cover layer 132 may be formed on the first cover layer 131. The difference in the growth rates of the second cover layer 132 over the top surface and the side surface of the stress layer 120 may be a second growth rate difference. The second growth rate difference may be larger than the first growth rate difference.

Specifically, second source gas may be used to form the second cover layer 132 on the first cover layer 131. The difference in the deposition rates of the second source gas over the top surface and the side surface of the stress layer 120 may be the second growth rate difference.

Similarly, the second cover layer 132 may be formed on the first cover layer 131 by a chemical vapor deposition process. Specifically, the second cover layer 132 may be formed on the first cover layer 131 by a reduced pressure chemical vapor deposition process to improve the formation quality of the second cover layer 132.

In one embodiment, the first cover layer 131 and the second cover layer 132 may form a cover layer configured to subsequently form the self-aligned silicide. Therefore, the first cover layer 131 and the second cover layer 132 may be made of the same material, for example silicon. Therefore, in one embodiment, the first source gas may include dichlorosilane, and the second source gas may include monosilane.

During the self-aligned silicide process, if the thickness of the cover layer is too small, the subsequently formed metal layer may be directly contacted with the stress layer 120, and high resistance silicide may be formed after an annealing process, thus increasing the contact resistance between the stress layer 120 and a metal plug. If the thickness of the cover layer is too thick, the spacing between cover layers formed on opposite surfaces of the adjacent stress layers 120 may be small, and the cover layers may even be connected, thus easily causing the formed silicide to be connected and resulting in a short-circuit issue.

Because the second growth rate difference of the second source gas may be larger than the first growth rate difference of the first source gas, compared to the second cover layer 132, the thickness of the first cover layer 131 may be more uniform. The thickness of the cover layer formed on the top surface and the side surface of the stress layer 120 can be controlled respectively by controlling the formation ratio of the first cover layer 131 to the second cover layer 132. Thus, the direct contact of the subsequently formed metal layer and the stress layer 120 caused by the too small thickness of the cover layer may be avoided, and the short-circuit issue resulted from the connection of cover layers caused by the too thick thickness of the cover layer can also be avoided.

The specific thickness of the first cover layer 131 and the second cover layer 132 may be related to the specific design of the semiconductor structure. When the design requires a large distance between the active areas, the cover layer may be formed by the first cover layer with a large thickness and the second cover layer with a small thickness, so as to avoid the thickness of the cover layer being too small. When the design requires a small distance between the active areas, the cover layer may be formed by the first cover layer with a small thickness and the second cover layer with a large thickness. Such that it can be ensured that the thickness of the cover layers on opposite surfaces (side surfaces) of the adjacent stress layers is small on the premise of the stress layer being completely covered, so as to avoid the short-circuit issue resulted from the connection of the cover layers.

Specifically, in one embodiment, the first source gas may be dichlorosilane. Because the symmetry of the dichlorosilane molecular structure is low, the selectivity of the silicon layer formed by using dichlorosilane as the silicon source to the crystal plane may be weak. In other words, during forming the first cover layer 131 by using dichlorosilane as the silicon source, the deposition rates of the silicon atoms on the top surface and the side surface of the stress layer 120 may be similar. Therefore, during forming the first cover layer 131 by using dichlorosilane as the silicon source, the growth rate of the first cover layer 131 on the top surface of the stress layer 120 may be similar as the growth rate of the first cover layer 131 on the side surface of the stress layer 120. Thus the thickness of the first cover layer 131 formed by using dichlorosilane as the silicon source may be uniform.

The second source gas may include monosilane. Because the symmetry of the monosilane molecular structure is high, the selectivity of the silicon layer formed by using monosilane as the silicon source to the crystal plane may be high. In other words, during forming the second cover layer 132 by using monosilane as the silicon source, the deposition rates of the silicon atoms on the top surface and the side surface of the stress layer 120 may be quite different.

When forming the second cover layer 132 by using monosilane as the silicon source, the growth rate of the second cover layer 132 on the top surface of the stress layer 120 may be quite different from the growth rate of the second cover layer 132 on the side surface of the stress layer 120. Thus, when monosilane is used as the silicon source, the thickness of the second cover layer 132 formed on the top surface of the stress layer 120 may be larger than the thickness of the second cover layer 132 formed on the side surface of the stress layer 120.

For illustrative purposes, dichlorosilane is used to first form the first cover layer 131 and then monosilane is used to form the second cover layer 132. The first cover layer 131 may also serve as a buffer layer between the second cover layer 132 and the stress layer 120, thus improving the lattice mismatch between the stress layer 120 and the second cover layer 132, and improving the performance of the formed cover layer. Other materials may also be used.

In one embodiment, during the reduced pressure chemical vapor deposition process to form the first cover layer 131 and the second cover layer 132, the process temperature may be in a range of approximately 550-750° C., and the gas pressure may be in a range of approximately 0-50 Torr.

Returning to FIG. 7, after forming the second cover layer, a metal layer may be formed on the second cover layer (S104). FIG. 6 illustrates a corresponding semiconductor structure.

As shown in FIG. 6, after forming the first cover layer 131 and the second cover layer 132, the fabrication process also includes forming a metal layer 140 on the second cover layer.

The metal layer 140 may cover the surface of the cover layer formed by the first cover layer 131 and the second cover layer 132. The metal layer 140 may react with the cover layer to form low resistance silicide by a subsequent annealing process to lower the contact resistance of the stress layer 120. Specifically, the metal layer 140 may be made of nickel. The metal layer 140 may be formed on the cover layer by a chemical vapor deposition process, a physical vapor deposition process, or an atomic layer deposition, etc.

The metal layer 140 may also cover the surface of the isolation structure 110 (not labeled). Because the isolation structure 110 may be made of oxide, the metal layer 140 may not react with the isolation structure 110 by controlling the annealing process. Such that the formation of silicide is a self-aligned process. After performing the annealing process, the unnecessary metal layer may be removed by an etching process, such that the formed silicide may only cover the stress layer 120.

Accordingly, in the disclosed embodiments, the first cover layer may be formed on the stress layer, and the second cover layer may be formed on the first cover layer. The second growth rate difference may be larger than the first growth rate difference. Therefore, the difference in thicknesses of the first cover layer formed on the top surface and the side surface of the stress layer may be smaller than the difference in thicknesses of the second cover layer formed on the top surface and the side surface of the stress layer. Further, the thickness of the first cover layer and the second cover layer formed on the top surface and the side surface of the stress layer can be flexibly controlled by adjusting the ratio of the first cover layer to the second cover layer. This can effectively improve the performance of the formed silicide, and the performance of the formed semiconductor device.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   forming a base substrate including a substrate and a stress layer formed in the substrate, wherein a top surface of the stress layer is higher than a surface of the substrate;
   forming a first cover layer on the stress layer using a first source gas, such that a growth rate of the first cover layer on the top surface of the stress layer and a growth rate of the first cover layer on a side surface of the stress layer are substantially uniform; and
   forming a second cover layer on the first cover layer using a second source gas, such that a growth rate of the second cover layer on the top surface of the stress layer is greater than a growth rate of the second cover layer on the side surface of the stress layer, wherein the first and second cover layers are made of a same material.

2. The method according to claim 1, wherein:
   the first source gas and the second source gas are different from each other, and
   the second source gas has a molecular structure that is more symmetrical than the first source gas for forming the second cover layer on the first cover layer.

3. The method according to claim 1, wherein:
   the first source gas includes a first silicon source, the first source gas including dichlorosilane, such that deposition rates of silicon atoms on the top surface and the side surface of the stress layer is similar.

4. The method according to claim 1, wherein:
   the second source gas includes a second silicon source, the second source gas including monosilane, such that deposition rates of silicon atoms on the top surface is greater than on the side surface of the stress layer.

5. The method according to claim 1, wherein:
   the first cover layer and the second cover layer, made of the same material, are silicon layers.

6. The method according to claim 1, wherein:
   the first cover layer and the second cover layer forms a cover layer; and
   thicknesses of the first and second cover layers formed on the top surface and the side surface of the stress layer are controlled respectively by controlling a formation ratio of the first cover layer to the second cover layer.

7. The method according to claim 1, wherein:
   a first chemical vapor deposition process and a second chemical vapor deposition process are performed to form the first cover layer and the second cover layer, respectively,
   each of the first and second chemical vapor deposition processes includes a reduced pressure chemical vapor deposition process.

8. The method according to claim 7, wherein during the reduced pressure chemical vapor deposition process:
   a process temperature is in a range of approximately 550-750° C.; and
   a gas pressure is in a range of approximately 0-50 Torr.

9. The method according to claim 1, wherein forming the base substrate includes:
   providing a substrate;
   forming an opening in the substrate; and
   filling the opening with stress material to form the stress layer.

10. The method according to claim 9, wherein during forming the stress layer:
    a chemical vapor deposition process is performed to fill the opening with the stress material to form the stress layer, wherein the chemical vapor deposition processes includes a reduced pressure chemical vapor deposition process.

11. The method according to claim 10, wherein during the chemical vapor deposition process:
    the stress material is germanium-silicon;
    a process temperature is in a range of approximately 550-750° C.;
    a pressure of process gases is in a range of approximately 0-50 Ton; and
    the process gases include monosilane, disilane, dichlorosilane, and germane.

12. The method according to claim 11, wherein:
    the stress layer is a P-type doped stress layer; and
    the process gases also include diborane.

13. The method according to claim 9, wherein:
    forming the opening includes: forming a plurality of the discrete openings, and
    forming the stress layer includes: filling the plurality of the discrete openings with the stress material to form a plurality of the discrete stress layers, wherein all top surfaces of a plurality of the stress layers are higher than the surface of the substrate.

14. The method according to claim 9, wherein:
    the substrate is configured to form a P-type transistor.

15. The method according to claim 1, after forming the first cover layer and the second cover layer, further including:
    forming a metal layer on the second cover layer.

16. The method according to claim 15, wherein:
    the metal layer is made of nickel.

17. The method according to claim 15, wherein:
    the metal layer is formed by a chemical vapor deposition process, a physical vapor deposition process, or an atomic layer process.

18. The method according to claim 15, further including:
    forming an isolation structure in the substrate between adjacent stress layers, wherein:
    a first portion of each of the second cover layer and the metal layer is formed on the isolation structure and a second portion of each of the second cover layer and the metal layer is formed on a surface of the substrate.

19. The method according to claim 1, wherein:
    when the semiconductor structure includes active areas having a large distance there-between, the first cover layer has a large thickness and the second cover layer has a small thickness; and
    when the semiconductor structure includes active areas having a small distance there-between, the first cover layer has a small thickness and the second cover layer has a large thickness.

* * * * *